(12) United States Patent
Shih

(10) Patent No.: US 10,340,203 B2
(45) Date of Patent: Jul. 2, 2019

(54) SEMICONDUCTOR STRUCTURE WITH THROUGH SILICON VIA AND METHOD FOR FABRICATING AND TESTING THE SAME

(71) Applicant: UNITED MICROELECTRONICS CORP., Hsin-Chu (TW)

(72) Inventor: Hsueh-Hao Shih, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 40 days.

(21) Appl. No.: 14/174,850

(22) Filed: Feb. 7, 2014

(65) Prior Publication Data
US 2015/0228547 A1    Aug. 13, 2015

(51) Int. Cl.
*H01L 21/66* (2006.01)
*H01L 23/48* (2006.01)
*H01L 23/00* (2006.01)

(52) U.S. Cl.
CPC ............ *H01L 23/481* (2013.01); *H01L 22/14* (2013.01); *H01L 22/30* (2013.01); *H01L 22/32* (2013.01); *H01L 24/05* (2013.01)

(58) Field of Classification Search
CPC ......... H01L 23/481; H01L 2225/06596; H01L 22/30; G01R 31/04; G01R 31/26; G01R 31/2884
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |

(Continued)

FOREIGN PATENT DOCUMENTS

CN    103367281 A    10/2013

*Primary Examiner* — Lex H Malsawma
*Assistant Examiner* — Geoffrey H Ida
(74) *Attorney, Agent, or Firm* — Winston Hsu

(57) ABSTRACT

A semiconductor structure with a through silicon via includes a substrate having a front side and a back side. The through silicon via penetrates the substrate. A device is disposed on the front side of the substrate. Numerous dielectric layers cover the front side. A first test pad for testing the device is disposed on the front side of the substrate. A second test pad for testing the through silicon via is disposed on the back side of the substrate. A method of fabricating and testing the semiconductor structure is also provided.

7 Claims, 7 Drawing Sheets

(56) References Cited

U.S. PATENT DOCUMENTS

| | | | | |
|---|---|---|---|---|
| 5,627,106 | A | 5/1997 | Hsu | |
| 5,793,115 | A | 8/1998 | Zavracky | |
| 5,977,640 | A | 11/1999 | Bertin | |
| 5,986,460 | A * | 11/1999 | Kawakami | G01R 1/07307 257/48 |
| 6,018,196 | A | 1/2000 | Noddin | |
| 6,143,616 | A | 11/2000 | Geusic | |
| 6,274,937 | B1 | 8/2001 | Ahn | |
| 6,309,956 | B1 | 10/2001 | Chiang | |
| 6,391,777 | B1 | 5/2002 | Chen | |
| 6,407,002 | B1 | 6/2002 | Lin | |
| 6,440,640 | B1 | 8/2002 | Yang | |
| 6,483,147 | B1 | 11/2002 | Lin | |
| 6,525,419 | B1 | 2/2003 | Deeter | |
| 6,548,891 | B2 | 4/2003 | Mashino | |
| 6,551,857 | B2 | 4/2003 | Leedy | |
| 6,627,985 | B2 | 9/2003 | Huppenthal | |
| 6,633,083 | B2 | 10/2003 | Woo | |
| 6,746,936 | B1 | 6/2004 | Lee | |
| 6,778,275 | B2 | 8/2004 | Bowes | |
| 6,800,930 | B2 | 10/2004 | Jackson | |
| 6,803,302 | B2 * | 10/2004 | Pozder | H01L 24/03 257/E21.508 |
| 6,812,193 | B2 | 11/2004 | Brigham | |
| 6,831,013 | B2 | 12/2004 | Tsai | |
| 6,897,148 | B2 | 5/2005 | Halahan | |
| 6,924,551 | B2 | 8/2005 | Rumer | |
| 6,930,048 | B1 | 8/2005 | Li | |
| 7,034,401 | B2 | 4/2006 | Savastiouk | |
| 7,052,937 | B2 | 5/2006 | Clevenger | |
| 7,075,133 | B1 | 7/2006 | Padmanabhan | |
| 7,098,070 | B2 | 8/2006 | Chen | |
| 7,111,149 | B2 | 9/2006 | Eilert | |
| 7,166,913 | B2 | 1/2007 | Chinthakindi | |
| 7,222,420 | B2 | 5/2007 | Moriizumi | |
| 7,282,951 | B2 | 10/2007 | Huppenthal | |
| 7,323,785 | B2 | 1/2008 | Uchiyama | |
| 7,338,896 | B2 | 3/2008 | Vanhaelemeersch | |
| 7,402,515 | B2 | 7/2008 | Arana | |
| 7,432,592 | B2 | 10/2008 | Shi | |
| 7,531,415 | B2 | 5/2009 | Kwok | |
| 7,541,677 | B2 | 6/2009 | Kawano | |
| 7,564,115 | B2 | 7/2009 | Chen | |
| 7,598,607 | B2 | 10/2009 | Chung | |
| 7,633,165 | B2 | 12/2009 | Hsu | |
| 7,732,926 | B2 | 6/2010 | Uchiyama | |
| 7,795,735 | B2 | 9/2010 | Hsu | |
| 7,812,426 | B2 | 10/2010 | Peng | |
| 7,816,227 | B2 | 10/2010 | Chen | |
| 7,825,024 | B2 | 11/2010 | Lin | |
| 7,825,517 | B2 | 11/2010 | Su | |
| 7,843,064 | B2 | 11/2010 | Kuo | |
| 7,846,837 | B2 | 12/2010 | Kuo | |
| 7,851,346 | B2 | 12/2010 | Lee | |
| 7,928,534 | B2 | 4/2011 | Hsu | |
| 7,932,608 | B2 | 4/2011 | Tseng | |
| 7,939,941 | B2 | 5/2011 | Chiou | |
| 7,955,895 | B2 | 6/2011 | Yang | |
| 7,956,442 | B2 | 6/2011 | Hsu | |
| 7,969,013 | B2 | 6/2011 | Chen | |
| 8,026,592 | B2 | 9/2011 | Yoon | |
| 8,034,708 | B2 | 10/2011 | Kuo | |
| 8,049,327 | B2 | 11/2011 | Kuo | |
| 8,053,898 | B2 | 11/2011 | Marcoux | |
| 8,053,900 | B2 | 11/2011 | Yu | |
| 8,053,902 | B2 | 11/2011 | Chen | |
| 8,063,496 | B2 | 11/2011 | Cheon | |
| 8,421,073 | B2 | 4/2013 | Lin | |
| 8,471,577 | B2 | 6/2013 | Stillman | |
| 2001/0038972 | A1 | 11/2001 | Lyons | |
| 2003/0164551 | A1 * | 9/2003 | Lee | H01L 21/563 257/778 |
| 2004/0080041 | A1 | 4/2004 | Kimura | |
| 2004/0188817 | A1 | 9/2004 | Hua | |
| 2005/0030055 | A1 * | 2/2005 | Tran | G01R 31/2884 324/750.3 |
| 2005/0064707 | A1 * | 3/2005 | Sinha | 438/667 |
| 2005/0112997 | A1 | 5/2005 | Lin | |
| 2005/0136635 | A1 | 6/2005 | Savastiouk | |
| 2005/0205991 | A1 | 9/2005 | Chen | |
| 2006/0035146 | A1 | 2/2006 | Hayashi | |
| 2006/0042834 | A1 | 3/2006 | Lee | |
| 2007/0117348 | A1 | 5/2007 | Ramanathan | |
| 2007/0126085 | A1 | 6/2007 | Kawano | |
| 2007/0190692 | A1 | 8/2007 | Erturk | |
| 2008/0073747 | A1 | 3/2008 | Chao | |
| 2008/0108193 | A1 | 5/2008 | You | |
| 2009/0127667 | A1 | 5/2009 | Iwata | |
| 2009/0134498 | A1 | 5/2009 | Ikeda | |
| 2009/0180257 | A1 | 7/2009 | Park | |
| 2009/0224405 | A1 | 9/2009 | Chiou | |
| 2009/0278251 | A1 | 11/2009 | Tsai | |
| 2010/0001379 | A1 | 1/2010 | Lee | |
| 2010/0007001 | A1 * | 1/2010 | Wang et al. | 257/686 |
| 2010/0133534 | A1 * | 6/2010 | Do | H01L 21/563 257/48 |
| 2010/0140749 | A1 | 6/2010 | Kuo | |
| 2010/0140772 | A1 | 6/2010 | Lin | |
| 2010/0244247 | A1 | 9/2010 | Chang | |
| 2010/0323478 | A1 | 12/2010 | Kuo | |
| 2011/0049728 | A1 | 3/2011 | Pagani | |
| 2011/0204357 | A1 * | 8/2011 | Izuha | 257/48 |
| 2011/0316572 | A1 | 12/2011 | Rahman | |
| 2013/0169355 | A1 * | 7/2013 | Chen et al. | 327/564 |
| 2013/0249532 | A1 | 9/2013 | Lin | |

* cited by examiner

SEMICONDUCTOR STRUCTURE WITH THROUGH SILICON VIA AND METHOD FOR FABRICATING AND TESTING THE SAME

BACKGROUND OF THE INVENTION

1. Field of the Invention

The invention relates generally to a semiconductor structure with a through silicon via and a method of fabricating and testing the same, and more particularly to a semiconductor structure with a through silicon via having test pads on two sides of the substrate.

2. Description of the Prior Art

The manufacture and development of integrated circuits has undergone continuous rapid growth due to constant improvements in the integration density of various electronic components.

Wire bonding is a method for forming connections between integrated circuits (ICs) and a package containing ICs, or forming a direct connection to a printed circuit board. In wire bonding, a wire is used to create an electrical connection from bonding pads on the ICs and the package. The wire may be made from gold, aluminum, copper or alloys thereof.

A recent method of increasing circuit density which can integrate multiple devices into a single package involves stacking two or more ICs on different dies vertically or horizontally in a package. In such stacked-die devices, through-silicon vias (TSVs) may be used to interconnect multiple devices and to connect the devices to pads on a package. TSVs allow vertical connections between devices through the body of substrate. This may provide shorter physical connections between devices and enables higher density and higher aspect ratio connections. After the formation of TSVs, TSVs have to be tested to make sure they are workable and be implemented accurately.

SUMMARY OF THE INVENTION

It is an objective of the present invention to provide a semiconductor structure with a through silicon via, and a method for fabricating and testing the semiconductor structure.

According to a preferred embodiment of the present invention, a semiconductor structure with a through silicon via includes a substrate comprising a front side and a back side. A plurality of dielectric layers comprises an inner circuit disposed on the front side of the substrate. At least one through silicon via penetrates the substrate. A first bond pad is disposed on a surface of the dielectric layers and connects electrically to the inner circuit. A first test pad is disposed on the surface of the dielectric layers and connects electrically to the first bond pad. A second bond pad is disposed on the back side of the substrate and connects electrically to the through silicon via. A second test pad is disposed on the back side of the substrate and connects electrically to the second bond pad.

According to another preferred embodiment of the present invention, a fabricating method of a semiconductor structure with a through silicon via includes providing a substrate comprising a front side and a back side. Then, a device is formed and disposed on the front side of the substrate. A plurality of dielectric layers is formed on the front side of the substrate. Next, the following steps are performed without specific fabricating sequences: a first test pad is formed on a surface of the dielectric layers and the first test pad electrically connects to the device. The first test pad is tested. At least one through silicon via is formed to penetrate the substrate. A second test pad is formed and disposed on the back side of the substrate and the second test pad electrically connects to the through silicon via. The second test pad is tested to determine if the through silicon via works.

According to yet another preferred embodiment of the present invention, a test method of a semiconductor structure with a through silicon via includes first providing a semiconductor structure with a through silicon via. The semiconductor structure with a through silicon via includes a substrate comprising a front side and a back side, a plurality of dielectric layers comprising a device disposed on the front side of the substrate, at least one through silicon via penetrating the substrate, a first test pad disposed on a surface of the dielectric layers and electrically connecting to the device and a second test pad disposed on the back side of the substrate and electrically connecting to the through silicon via. The test method of the present invention further includes testing the first test pad and testing the second test pad later. Alternatively, the second test pad can be tested before the first test pad. In another example, the first test pad and the second test pad can be tested simultaneously.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a semiconductor structure with a through silicon via and a method for fabricating and testing the same. The semiconductor structure of the present invention can be fabricated by a via first process, a via middle process or a via last process. The via first process may be divided into two categories, wherein one category forms the through silicon via structures before the MOS transistors are formed, and the other category forms the through silicon via structures after the MOS transistors are formed. In the following description, numerous semiconductor structures with a through silicon via are given to provide a thorough understanding of the invention but the applications of the present invention are not only limited to these embodiments.

Figure 1:
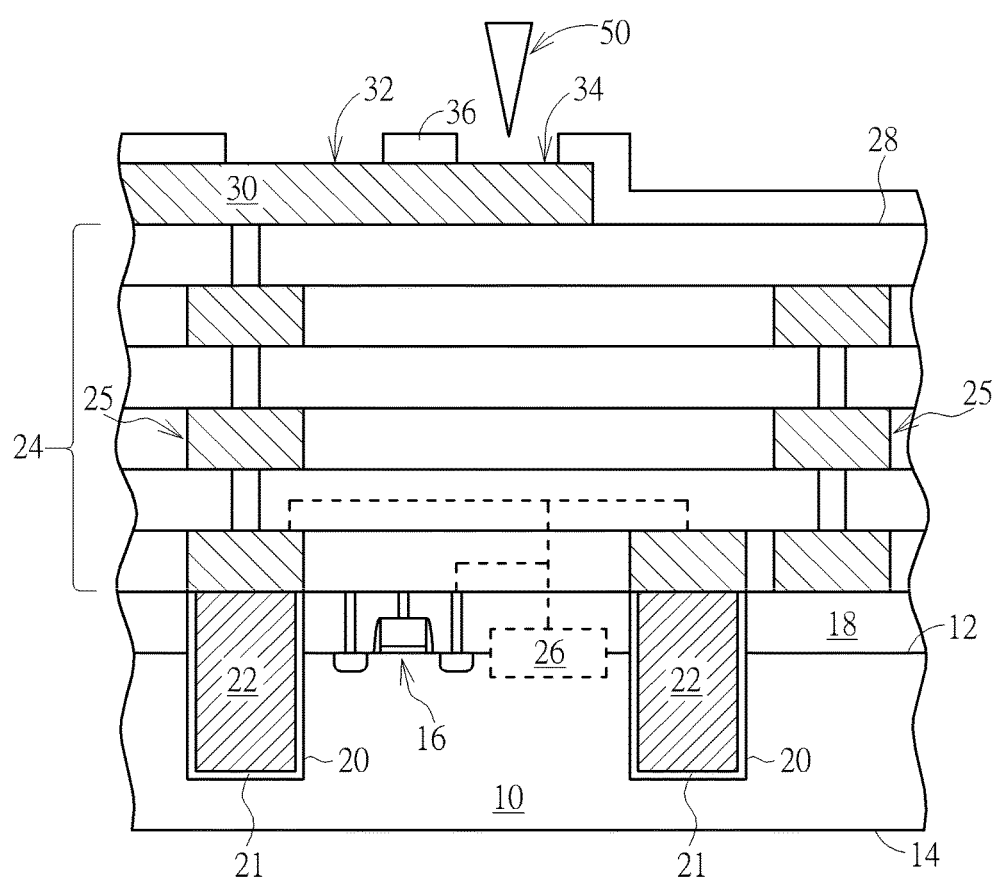
FIG. 1 to FIG. 2 illustrate a fabricating method for a semiconductor structure with a through silicon via according to a first preferred embodiment of the present invention.
Figure 2:
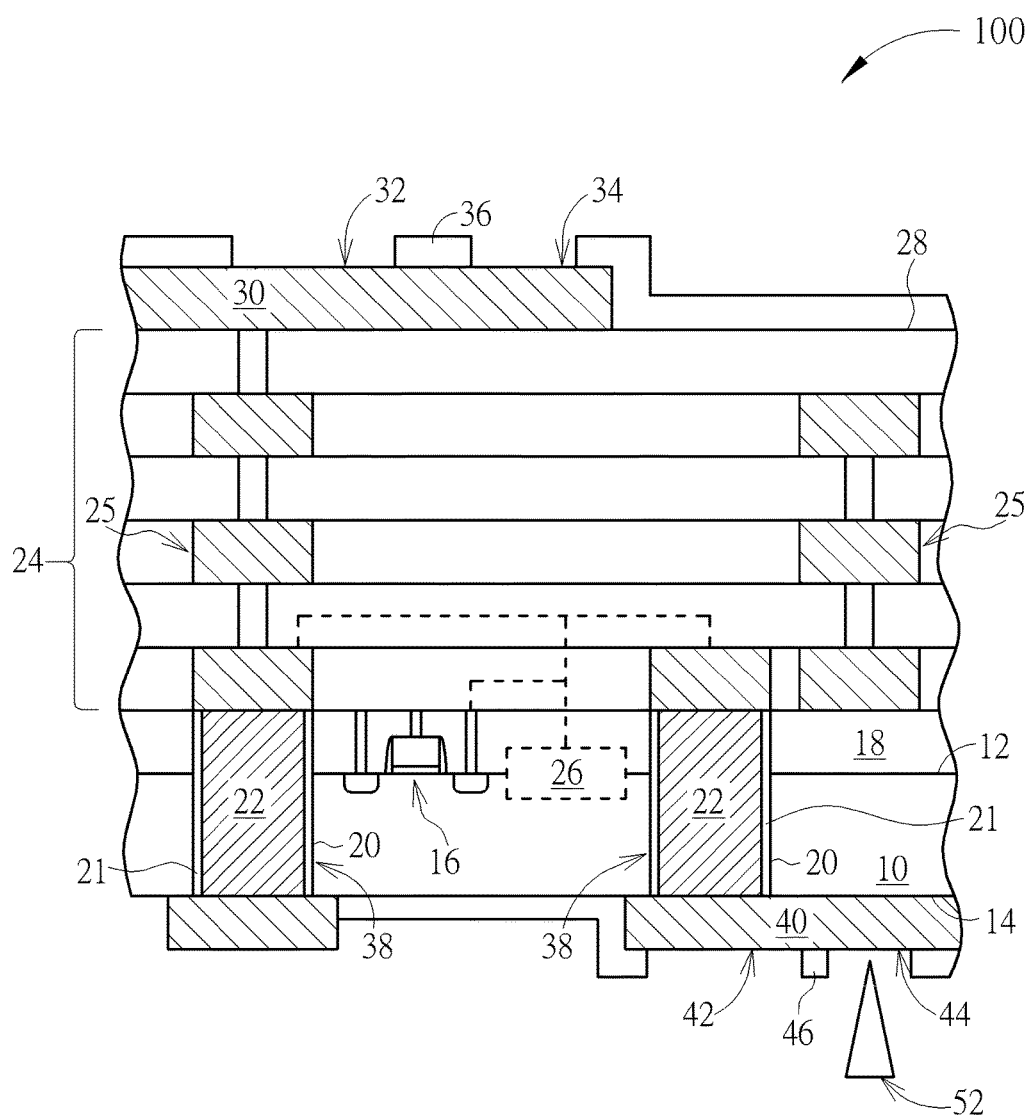

FIG. 1 to FIG. 2 illustrate a fabricating method for a semiconductor structure with a through silicon via according to a first preferred embodiment of the present invention. According to the first preferred embodiment, the through silicon via is formed by a via middle process. More specifically, the through silicon via is formed after the MOS transistor is formed and before the interconnections are formed. As shown in FIG. 1, a substrate 10 is provided. The substrate 10 may be a silicon substrate, a silicon containing substrate, or an III-V group-on-silicon (such as GaN-on-silicon) substrate or a graphene-on-silicon substrate. The substrate 10 has a front side 12 and a back side 14 opposite to the front side 12. Semiconductor devices and interconnections will subsequently be located on the front side 12. The back side 14 is the bottom of the substrate 10. An active device 16, such as a MOS transistor, is formed on the front side 12 of the substrate 10. Then, an interlayer dielectric layer 18 is formed to cover the active device 16 and the front side 12 of the substrate 10. Subsequently, at least one recess 20 is formed in the substrate 10 and the interlayer dielectric layer 18. Then, a material layer 22 fills in the recess 20. In this embodiment, the material layer 22 may be a conductive layer comprising metal, doped polysilicon or other conductive layer. Additionally, a liner 21 may be formed between the material layer 22 and the recess 20. The liner may be silicon oxide, silicon nitride, the combination thereof or other materials. In other to remove the material layer 22 outside of the recess 20, a planarization process such as an etching process or a chemical mechanical polishing process is performed after the material layer 22 is formed. Therefore, the top surface of the material layer 22 is even or coplanar with the top surface of the interlayer dielectric layer 18.

Numerous inter-metal dielectric layers 24 are formed on the interlayer dielectric layer 18. Metal interconnections 25 and inner circuits 26 are formed within the inter-metal dielectric layers 24. The metal interconnections 25 may include numerous metal layers and numerous plugs. The inner circuits 26 directly contact and electrically connect with the active device 16. Furthermore, the inner circuits 26 also electrically connect to the material layer 22. Moreover, the inner circuits 26 are preferably for helping the active device 16 to run the specific calculations. The metal layer or the contact plug of the metal interconnections 25 can be made of a single damascene process, a dual damascene process or a patterning process. Finally, a lateral continuous metal layer 30 is formed on a surface 28 of the topmost inter-metal dielectric layer 24. The metal layer 30 is divided into two parts. One part serves as a bond pad 32 and the other serves as a test pad 34. The bond pad 32 will function as junctions of a flip chip or as wire bonding. The test pad 34 will be tested by a probe 50 afterwards. A protective layer 36 may be optionally formed on the metal layer 30 to define the bond pad 32 and the test pad 34 on the metal layer 30.

As shown in FIG. 2, the substrate 10 is thinned from the back side 14 until the material layer 22 is exposed. The through silicon via 38 is finished at this point. Then, a continuous metal layer 40 is formed on the back side 14 of the substrate 10, and the metal layer electrically connects to the through silicon via 38. Similarly, the metal layer 40 is divided into two parts. One part serves as a bond pad 42 and the other serves as a test pad 44. The bond pad 42 will function as junctions of other chips or as wire bonding. The test pad 44 will be tested by a probe 52 afterwards. Additionally, a protective layer 46 may be optionally formed on the metal layer 40 to define the bond pad 42 and the test pad 44 on the metal layer 40. At this point, a semiconductor structure with a through silicon via 100 is completed.

Figure 3:
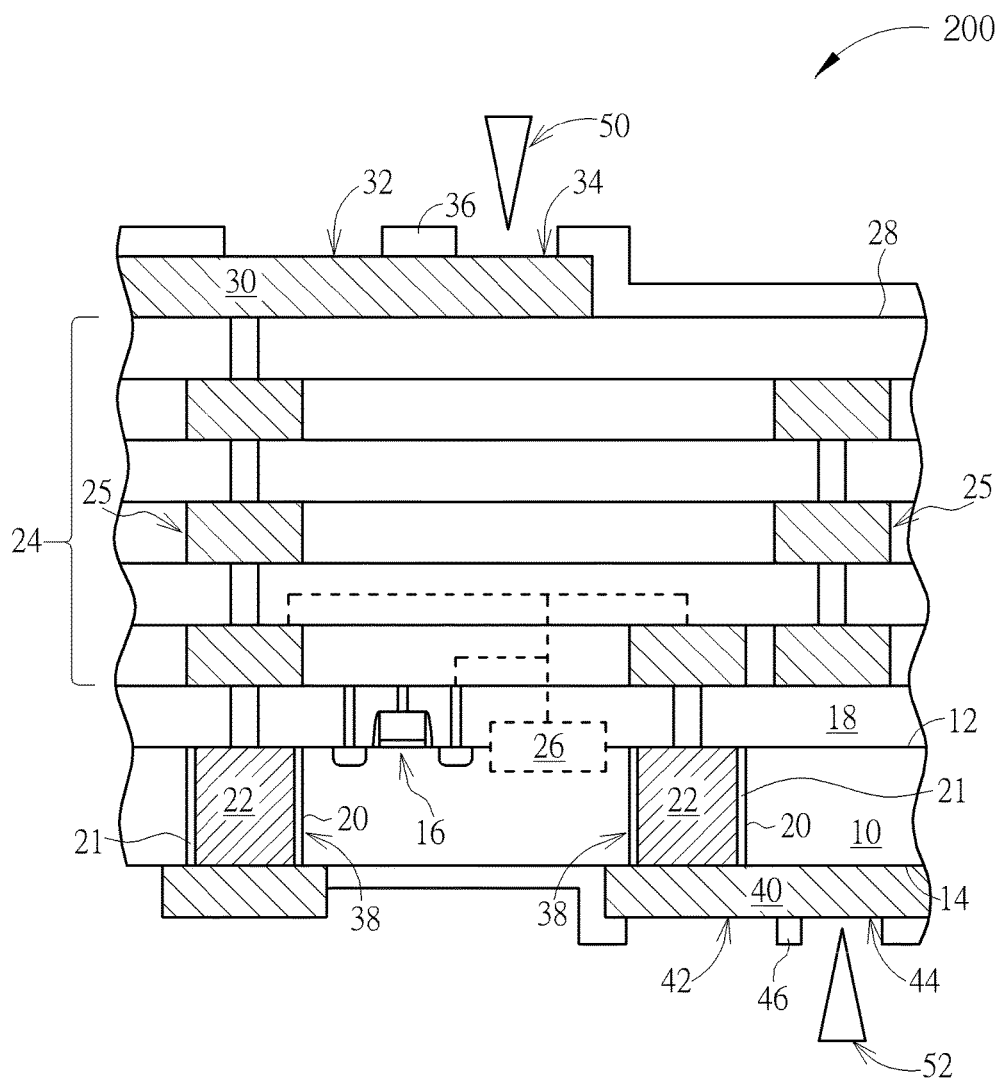
FIG. 3 illustrates a fabricating method for a semiconductor structure with a through silicon via according to a second preferred embodiment of the present invention.

FIG. 3 illustrates a fabricating method for a semiconductor structure with a through silicon via according to a second preferred embodiment of the present invention, wherein like reference numerals are used to refer to like elements throughout. As shown in FIG. 3, a semiconductor structure with a through silicon via 200 in this embodiment is formed by a via first process, and the through silicon via 38 is formed before the active device 16. Therefore, the recess 20 is formed and filled by the material layer 22 or a sacrifice layer (not shown) before the active device 16 is formed. As a result, the surface of the through silicon via 38 is aligned with the front side 12 of the substrate 10. If the sacrifice layer is utilized, the sacrifice layer will be removed from the back side 14, and be replaced by the conductive material layer 22. Please refer to FIG. 1 again. According to the first preferred embodiment, a surface of the through silicon via 38 is higher than the active device 16 and aligned with a surface of the interlayer dielectric layer 18. Besides the differences mentioned above, the fabricating steps and the structures disclosed in the second preferred embodiment are the same as that in the first preferred embodiment, and a detailed description is therefore omitted.

According to a third preferred embodiment of the present invention, the through silicon via 38 can be fabricated by a via last process. The recess 20 may be formed at the same step as that in the first preferred embodiment or the second preferred embodiment. After the inter-metal dielectric layers 24 are formed, the recess 20 may be formed in the substrate 10, the interlayer dielectric layer 18, and the inter-metal dielectric layers 24. The differences between this embodiment and the first preferred embodiment are that the material layer 22 filling in the recess is a sacrificial layer, such as silicon oxide or polysilicon. After this step, the back side 14 of the substrate 10 is thinned to expose the material layer 22, and the material layer 22 is replaced by a conductive layer. The conductive layer may be metal, doped silicon or other conductive materials. Besides the differences mentioned above, the fabricating steps and the structures disclosed in the third preferred embodiment are the same as that in the first and second preferred embodiment, and a detailed description is therefore omitted. Please refer to FIG. 2 or FIG. 3 for the detailed structure of the semiconductor structure with a through silicon via.

Please refer to FIG. 2 and FIG. 3. According to a fourth preferred embodiment of the present invention, the semiconductor structure with a through silicon via 100/200 includes a substrate 10 having a front side 12 and a back side 10. An active device 16 such as a MOS transistor is disposed on the front side 12 of the substrate 10. The interlayer dielectric layer 18 is disposed on the front side 12 of the substrate 10 to cover the active device 16. Numerous inter-metal dielectric layers 24 cover the interlayer dielectric layer 18. At least one through silicon via penetrates the substrate 10. A bond pad 32 and a test pad 34 are disposed on a surface 28 of the topmost inter-metal dielectric layer 24. In other words, the bond pad 32 and the test pad 34 are disposed on the front side of the substrate 10. The bond pad 32 and the test pad 34 are made of a continuous metal layer 30. The bond pad 32 and the test pad 34 electrically connect to each other. Additionally, a bond pad 42 and a test pad 44 are disposed on the back side 14 of the substrate 10. The bond pad 42 and the test pad 44 are made of a lateral continuous metal layer 40. The bond pad 42 and the test pad 44 electrically connect to each other. A protective layer 36 may be optionally disposed on the metal layer 30 to define the bond pad 32 and the test pad 34 on the metal layer 30. The bond pad 32 and the test pad 34 electrically connect to the active device 16. Similarly, a protective layer 46 may be optionally disposed on the metal layer 40 to define the bond pad 42 and the test pad 44 on the metal layer 40. The bond pad 42 and the test pad 44 on the back side 14 electrically connect to the through silicon via 38. Moreover, metal interconnections 25 and inner circuits 26 are disposed in the inter-metal dielectric layers 24. The inner circuits 26 directly contact and electrically connect with the active device 16. Furthermore, the inner circuits 26 also electrically connect to the material layer 22. Moreover, the inner circuits 26 are preferably for helping the active device 16 to run the specific calculations. Moreover, the inner circuit 26 may optionally include a voltage protective circuit (not shown) to protect the active device 16 from being damaged by high voltage. It is noteworthy that there are test pads 34/44 disposed at both front side 12 and the back side 14 of the substrate 10 in the semiconductor structure with a through silicon via 100/200. The test pad 34 at the front side 12 is for testing if the elements such as the active device 16 on the semiconductor structure 100/200 can work properly. The test pad 44 is for testing if the through silicon via 38 can work properly and/or if the through silicon via 38 can pass the reliability test. Furthermore, because the semiconductor structure with a through silicon via 100/200 includes at least one active element, the semiconductor structure with a through silicon via 100/200 serves as a chip. Additionally, the location of the through silicon via 38 may be slightly different based on which fabricating steps are applied to the through silicon via 38. For example, the via first process and the via last process will result in a different location of the through silicon via 38.

Figure 4:
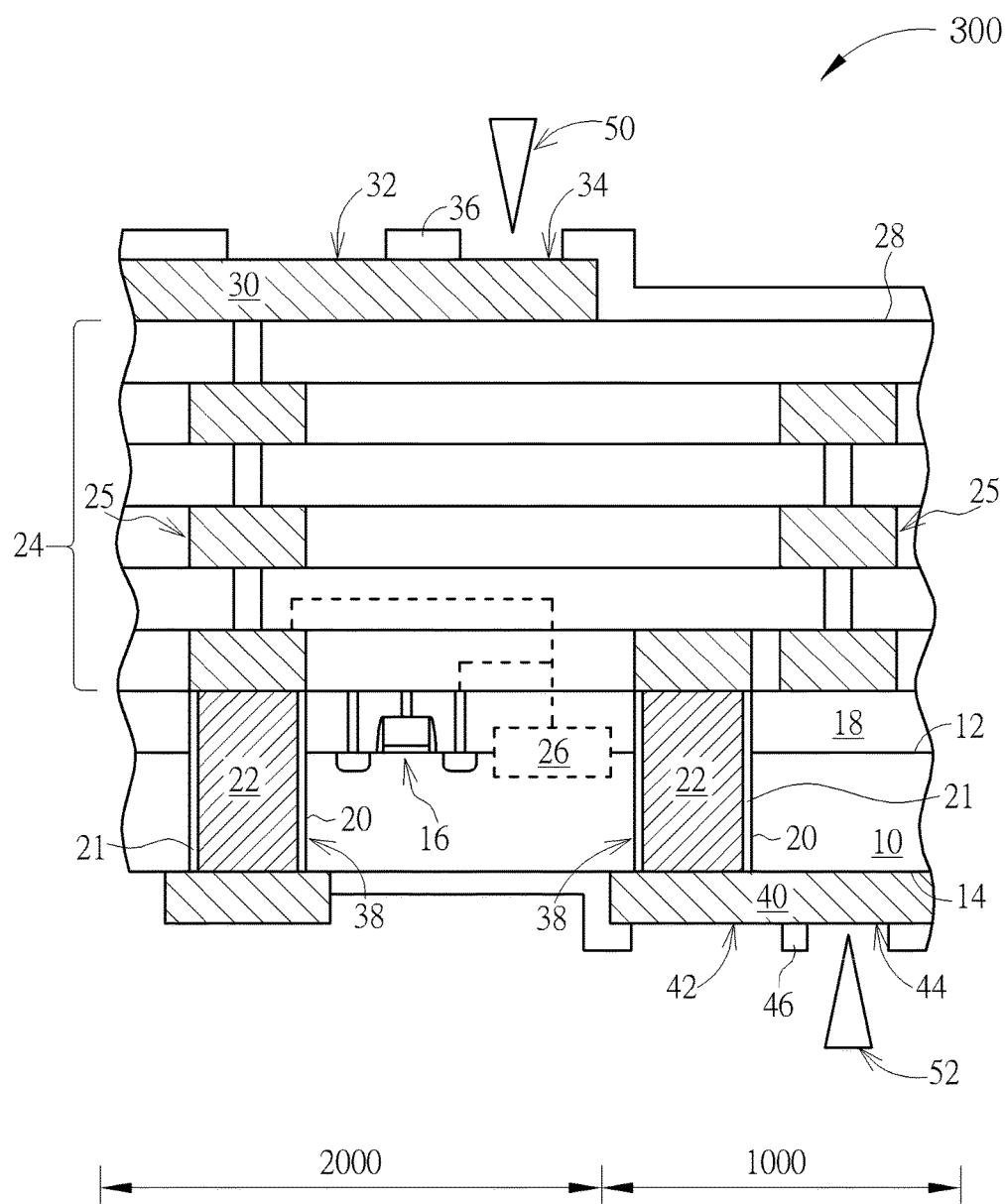
FIG. 4 schematically depicts the semiconductor structure with a through silicon via according to a fifth preferred embodiment of the present invention.

FIG. 4 depicts the semiconductor structure with a through silicon via schematically according to a fifth preferred embodiment of the present invention, wherein like reference numerals are used to refer to like elements throughout. As shown in FIG. 4, in a semiconductor structure with a through silicon via 300, the active device 16 does not electrically connect to the bond pad 42 and the test pad 44. More specifically, because the inner circuit 26 does not electrically connect to the through silicon via 38 coupling to the bond pad 42, the active device 16 cannot electrically connect to the bond pad 42 and the test pad 44. Similarly, according to different fabricating steps of the through silicon via 38, the location of the through silicon via 38 may be different. Moreover, the semiconductor structure with a through silicon via 300 is separated into a high voltage region 1000 and a low voltage region 2000. The through silicon via 38 coupling to the bond pad 42 and the test pad 44 is disposed within the high voltage region 1000. The active device 16, the bond pad 32 and the test pad 34 are disposed within the low voltage region 2000. The through silicon via 38 within the high voltage region 1000 only serves as a test device for testing the function of the through silicon via formed by the same process as the through silicon via 38 within the high voltage region 1000. Generally speaking, the through silicon via 38 within the high voltage region 1000 will not be an electrical connecting device between chips. Other structures in this embodiment are the same as those in the fourth preferred embodiment, and their description is therefore omitted herein.

Figure 5:
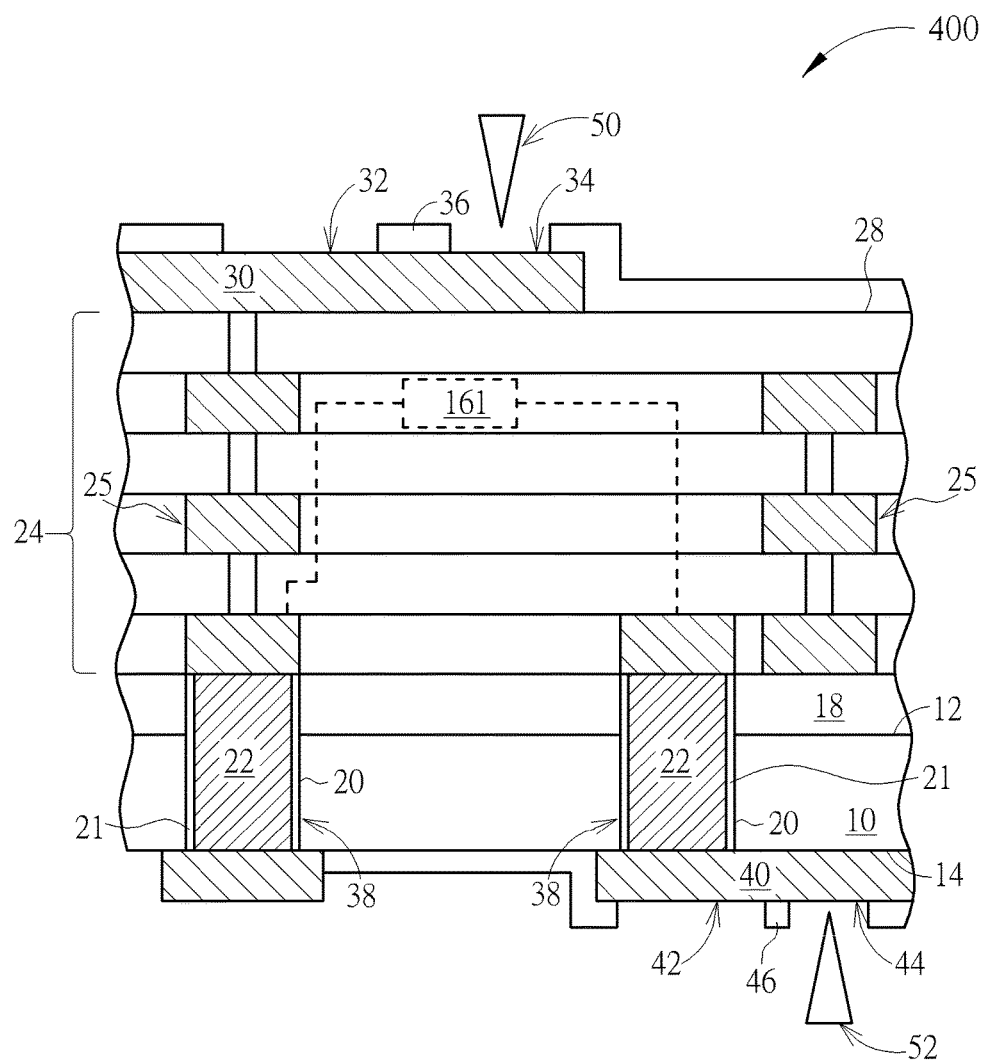
FIG. 5 schematically depicts the semiconductor structure with a through silicon via according to a sixth preferred embodiment of the present invention.

FIG. 5 depicts the semiconductor structure with a through silicon via schematically according to a sixth preferred embodiment of the present invention, wherein like reference numerals are used to refer to like elements throughout. The difference between the sixth and the fourth embodiment is that the semiconductor structure with a through silicon via 400 in the sixth preferred embodiment serves as an interposer. There is no active device disposed within the semiconductor structure with a through silicon via 400, and inner circuits for helping the active device also are not disposed in the through silicon via 400. The semiconductor structure with a through silicon via 400 can optionally include a passive device 161 disposed within the inter-metal dielectric layer 24. The passive device 161 may be a capacitor, an inductor or a resistor. Other structures in this embodiment are the same as those in the fourth preferred embodiment, and their description is therefore omitted herein.

During the fabricating steps of the semiconductor structure with a through silicon via, a probe can be used to test if the devices or the through silicon via work correctly. The following disclosed test method can be applied to all aforementioned semiconductor structures with a through silicon via.

Figure 6:
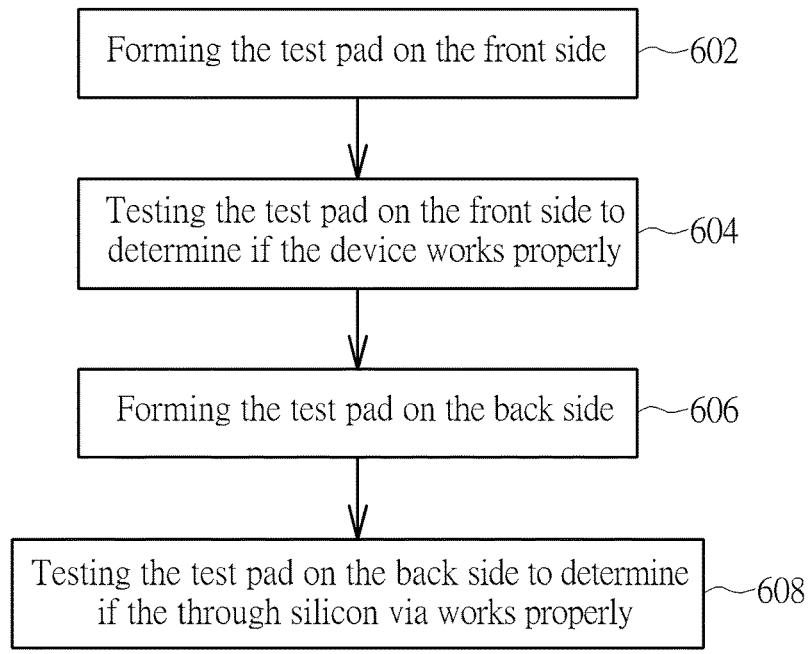
FIG. 6 illustrates a flow diagram of a method for testing a semiconductor structure with a through silicon via according to a seventh preferred embodiment of the present invention.

FIG. 6 illustrates a flow diagram of a method for testing a semiconductor structure with a through silicon via according to a seventh preferred embodiment of the present invention. The method in this embodiment is suitable to be performed together with the fabricating steps disclosed in the first, the second and the third preferred embodiment with the through silicon via fabricated by the via first process, the via middle process or the via last process. In the following description, however, the testing method will be performed together with the fabricating steps illustrated in the first embodiment as an example. Please refer to both FIG. 1 and FIG. 6. First, as indicated by a step 602, the test pad 42 is formed on the front side 12. Then, before the back side 14 is thinned, the test pad 34 on the front side 12 is tested by a probe 50, as indicated by a step 604. Because the test pad 34 electrically connects to the active device 16, it can be determined if the active device 16 works properly by using a feedback signal. Please refer to both FIG. 2 and FIG. 6. As indicated by a step 606, a test pad 44 on the back side 14 is formed. Later, as indicated by a step 608, the test pad 44 is test by the probe 52. Because the test pad 44 electrically connects to the through silicon via 38, it can be determined if the through silicon via 38 works properly and/or if the through silicon via 38 can pass the reliability test by using a feedback signal. The test method in the seventh preferred embodiment can also be applied to test the passive device shown in FIG. 5. The only difference is that, in the step 604, the feedback signal is used to determine if the passive device works properly.

Figure 7:
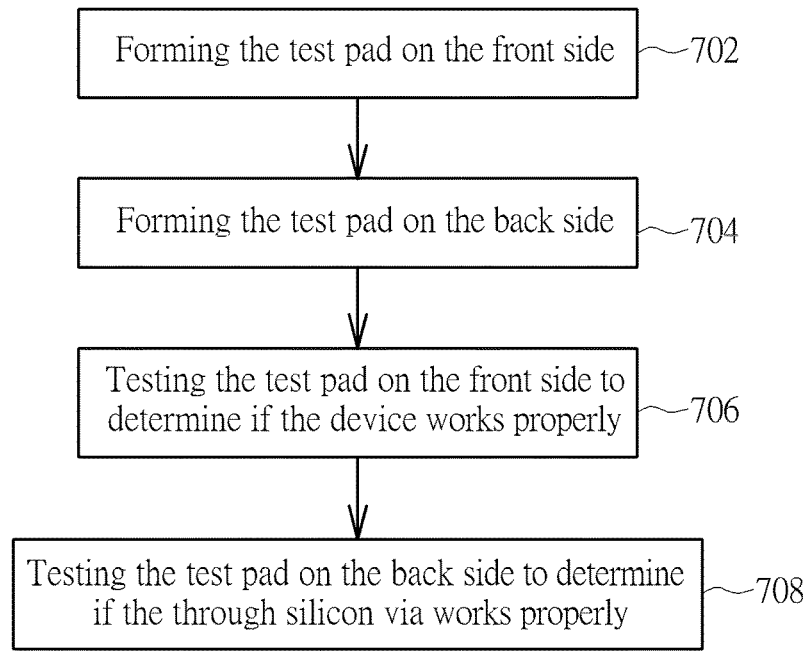
FIG. 7 illustrates a flow diagram of a method for testing a semiconductor structure with a through silicon via according to an eighth preferred embodiment of the present invention.

FIG. 7 illustrates a flow diagram of a method for testing a semiconductor structure with a through silicon via according to an eighth preferred embodiment of the present invention. The concept of the seventh and eighth preferred embodiment is the same. The test method in this embodiment is suitable to be applied to the semiconductor structure with a through silicon via formed by the via first, the via middle or the via last process. The test method in this embodiment can also be applied to the semiconductor structure with an active device or a passive device. In addition, the test method in this embodiment is especially suitable to test the semiconductor structure wherein the active device or passive device is electrically disconnected from the test pad on the back side: for example, the semiconductor structure with a through silicon via shown in FIG. 4 or FIG. 5. The following description will take the semiconductor structure with a through silicon via 300 in FIG. 4 as an example to explain the test method of the eighth preferred embodiment. Please refer to both FIG. 4 and FIG. 7. First, as indicated by steps 702 and 704, the test pad 42 is formed on the front side 12 and the test pad 44 is formed on the back side 14. Then, as indicated by a step 706, the test pad 34 on the front side is tested by the probe 50. It can be determined if the active device 16 or a passive device (not shown) works properly by using a feedback signal. Later, the test pad 44 on the back side 14 is tested by the probe 52 to determine if the through silicon via 38 works properly and/or if the through silicon via 38 can pass the reliability test.

Figure 8:
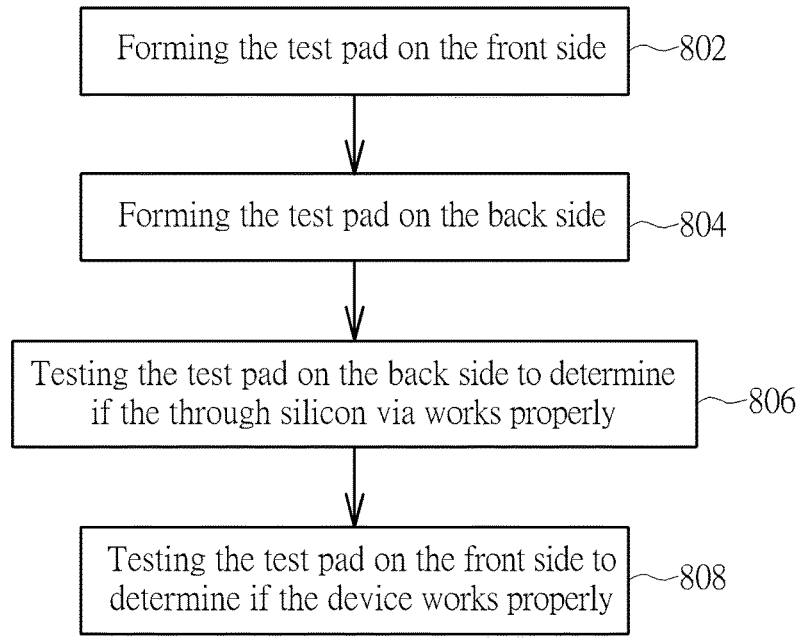
FIG. 8 illustrates a flow diagram of a method for testing a semiconductor structure with a through silicon via according to a ninth preferred embodiment of the present invention.

FIG. 8 illustrates a flow diagram of a method for testing a semiconductor structure with a through silicon via according to a ninth preferred embodiment of the present invention. The different between the eighth and ninth preferred embodiment is that, in the ninth preferred embodiment, after the test pads 34/44 are formed, the test pad 44 on the back side 14 is tested before the test pad 34 on the front side 12, as indicated in steps 802, 804, 806 and 808.

Figure 9:
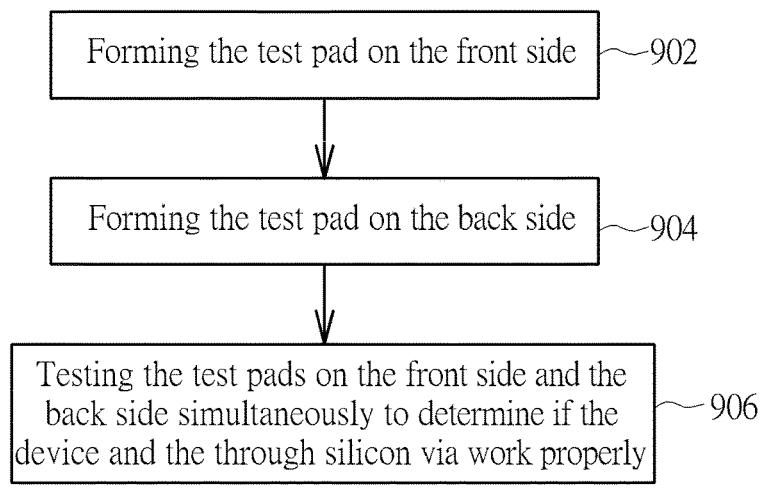
FIG. 9 illustrates a flow diagram of a method for testing a semiconductor structure with a through silicon via according to a tenth preferred embodiment of the present invention.

FIG. 9 illustrates a flow diagram of a method for testing a semiconductor structure with a through silicon via according to a tenth preferred embodiment of the present invention. This embodiment is only suitable for testing a semiconductor structure with a through silicon via electrically connecting to the test pad on the back side of the substrate, and the through silicon via made by the via first process, the via middle process or the via last process can be tested by the test method in this embodiment. The following description will take the semiconductor structure with a through silicon via 400 in FIG. 5 as an example. Please refer to FIG. 5 and FIG. 9. First, as indicated by steps 902 and 904, the test pad 34 is formed on the front side 12, and the test pad 44 is formed on the back side 14. Later, as indicated by a step 906, the test pad 34 is tested by the probe 50 and the test pad 44 is tested by the probe 52 simultaneously. It can be determined if the passive device 161 and the through silicon via 38 work properly by using a feedback signal. Similarly, the active device 16 and the through silicon via 38 in the FIG. 2 can be checked by the same method.

The semiconductor structure with a through silicon via provided in the present invention has test pads disposed on the front side and the back side of the substrate, respectively. The test pad on the front side is primarily for testing if the active device or the passive device works properly. The test pad on the back side is primarily for testing if the through silicon via works correctly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure with a through silicon via, comprising:
   a substrate comprising a front side and a back side, wherein the front side is opposite to the back side;
   a plurality of dielectric layers comprising an inner circuit disposed on the front side of the substrate, wherein the inner circuit is disposed within the plurality of dielectric layers, each of the plurality of dielectric layers directly contacts one of the plurality of dielectric layers;
   a first through silicon via penetrating the substrate;
   a second through silicon via penetrating the substrate;
   a first bond pad disposed on the front side, on the topmost surface of the dielectric layers and electrically connecting to the inner circuit and the first through silicon via;
   a first test pad disposed on the front side, directly contacting and on the topmost surface of the plurality of dielectric layers and connecting electrically to the first bond pad, wherein the first bond pad and the first test pad are made of a continuous metal layer, the first bond pad is directly contacted to the first test pad, and the first test pad has a first surface which is exposed and is tested by a first probe;
   a second bond pad disposed on the back side of the substrate and electrically connecting to the second through silicon via; and
   a second test pad disposed on and directly contacting the back side of the substrate and connecting electrically to the second bond pad, wherein the second test pad has a second surface which is exposed and is tested by a second probe, the second surface is opposite to the first surface, and the second test pad is the bottommost metal layer of the semiconductor structure with a through silicon via.

2. The semiconductor structure with a through silicon via of claim 1, further comprising one of an active device and a passive device.

3. The semiconductor structure with a through silicon via of claim 2, wherein the inner circuit electrically connects to one of the active device and the passive device.

4. The semiconductor structure with a through silicon via of claim 1, wherein the inner circuit does not electrically connect to the second through silicon via.

5. The semiconductor structure with a through silicon via of claim 1, wherein the inner circuit electrically connects to the first through silicon via.

6. The semiconductor structure with a through silicon via of claim 1, wherein the inner circuit further comprises a protective circuit.

7. The semiconductor structure with a through silicon via of claim 1, wherein the first through silicon via electrically connects to the second through silicon via, the first through silicon via passes through the substrate, and the second through silicon via passes through the substrate.

* * * * *